US011555865B1

(12) United States Patent
Raghavan et al.

(10) Patent No.: US 11,555,865 B1
(45) Date of Patent: Jan. 17, 2023

(54) METHOD FOR OPTIMIZING AN ELECTROMAGNETIC MEASUREMENT SENSOR ARRAY

(71) Applicant: The United States of America, as represented by the Secretary of the Navy, Arlington, VA (US)

(72) Inventors: Srikanth Raghavan, Olney, MD (US); Meagan M. Schaal, Germantown, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 219 days.

(21) Appl. No.: 16/861,765

(22) Filed: Apr. 29, 2020

(51) Int. Cl.
*G01R 33/00* (2006.01)
*G01V 3/08* (2006.01)

(52) U.S. Cl.
CPC ......... *G01R 33/0005* (2013.01); *G01V 3/083* (2013.01); *G01V 2003/086* (2013.01)

(58) Field of Classification Search
CPC ............... G01R 33/0005; G01V 3/083; G01V 2003/086
USPC ......................................................... 324/345
See application file for complete search history.

(56) References Cited

U.S. PATENT DOCUMENTS

| | | | |
|---|---|---|---|
| 8,113,072 B1 | 2/2012 | Smith, Jr. | |
| 9,035,657 B2* | 5/2015 | Zhang | G01V 3/28 |
| | | | 324/345 |
| 2012/0306501 A1* | 12/2012 | Schmidt | G01V 3/26 |
| | | | 324/345 |
| 2015/0145625 A1* | 5/2015 | Fukasawa | H01F 7/06 |
| | | | 324/345 |
| 2015/0153152 A1* | 6/2015 | Huang | G01V 3/08 |
| | | | 324/345 |

(Continued)

OTHER PUBLICATIONS

Shi, Pengfei, et al. "Topology optimization-based design of metamaterial-inspired sensor with improved sensitivity." Sensors and Actuators A: Physical 268 (2017): 83-90. (Year: 2017).*

(Continued)

*Primary Examiner* — Christopher P McAndrew
(74) *Attorney, Agent, or Firm* — Howard Kaiser (57) ABSTRACT

An exemplary inventive optimization model delineates a three-dimensional geometric environment for situation therein of electromagnetic sources and an electromagnetic sensor array used for measuring electric and magnetic fields emanating from the electromagnetic sources. Based on measurements and computations relating to electrical, magnetic, and structural physical properties, the geometric environment is stratified into air, sea, and seafloor regions as well as into electromagnetically distinct zones. The design of the electromagnetic sensor array is optimized through an iterative process involving successive determinations as to how well the electric and magnetic fields emanating from the electromagnetic sources may be calculated based on measurements taken in the geometric environment by the electromagnetic sensor array. Every instance of the electromagnetic sensor array in the iterative process is uniquely located and/or uniquely configured vis-à-vis every other instance. Design optimization can be performed with respect to various frequencies or frequency ranges.

12 Claims, 5 Drawing Sheets

(56) References Cited

U.S. PATENT DOCUMENTS

2015/0176404 A1* 6/2015 Smith ................ E21B 25/18
                                                    324/345
2015/0234073 A1* 8/2015 Sorensen ............ G01V 3/10
                                                    324/345

OTHER PUBLICATIONS

Liam A. Marsh et al., "Design of Electromagnetic Sensor Arrays Optimised for Inversion of the Magnetic Polarisability Tensor," 4 pages, IEEE, 978-1-4799-6117-7/15 (2015).

Krishnaswamy Sankaran, "Are you using the right tools in computational electromagnetics?", 19 pages, Engineering Reports, John Wiley & Sons Ltd., 1:e12041, accepted Sep. 6, 2019, first published Oct. 24, 2019.

Peter Holtham et al., "Electromagnetic Signature Modelling and Reduction," 9 pages, Undersea Defense Technology (UDT) Europe '99 (1999).

"Computational electromagnetics," 11 pages, Wikipedia, https://en.wikipedia.org/, webpage last edited on Mar. 21, 2020.

"Sensor array," 7 pages, Wikipedia, https://en.wikipedia.org/, webpage last edited on Apr. 13, 2019.

Meagan M. Schaal and Srikanth Raghavan, "Underwater Electromagnetic Alternating Signature Model," ABSTRACT (1 page), technical session No. 21476, 2018 Joint Undersea Warfare Technology Fall Conference, Oct. 22-25, 2018, Tampa, Florida; this abstract as shown is a technical session summary excerpted from the undersea sensors section on p. 25 of the conference program.

* cited by examiner

FIG. 11

METHOD FOR OPTIMIZING AN ELECTROMAGNETIC MEASUREMENT SENSOR ARRAY

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to sensor arrays, more particularly to methods, systems, and apparatuses for selecting optimal characteristics of electromagnetic measurement sensor arrays for given applications.

An electromagnetic measurement sensor array is a group of electromagnetic sensors that is constituted and configured for collecting and processing electromagnetic signals. According to current practice of performing electromagnetic sensor array measurements, land-based or submerged electromagnetic sensor arrays are optimized only for a narrow spectrum of sources and frequencies. Users routinely need to separately measure the electric and/or magnetic fields from sources and frequencies for which the sensor array system is not optimal. In the geophysics realm, conventional methods performed for geophysical prospecting using controlled source electromagnetic (CSEM) data have focused their attention on implementing robust inversion techniques to locate various geophysical features of interest, e.g., oil, gas, or mineral deposits.

Notwithstanding the effectiveness of some electromagnetic measurement sensor arrays that have heretofore been utilized, the need continues for greater accuracies and efficiencies in conducting such measurements.

SUMMARY OF THE INVENTION

In view of the foregoing, an object of the present invention is to provide a better methodology for optimizing an electromagnetic measurement sensor array, land-based or submerged, for efficient and accurate calibration of electromagnetic fields (EMFs) of a diverse set of sources, land-based or submerged, across a broad spectrum of frequencies.

Generally, an electromagnetic measurement sensor array system is customarily used to measure in-water or on-land electromagnetic fields produced by a diverse set of electric and/or magnetic sources. The electric and/or magnetic sources may include, for example, calibrated source electric and/or magnetic dipoles or other objects of interest. These sources produce electric and/or magnetic fields that vary as a function of physical factors including source geometry, sensor geometry, source frequency, environmental conditions (such as seawater conductivity and seawater bathymetry), and source type (e.g., electric versus magnetic). The terms "electromagnetic measurement sensor array" and "electromagnetic sensor array" are used interchangeably herein.

The present invention seeks to optimally design a sensor array in order for the sensor array system to measure the electromagnetic fields efficiently. The inventive sensor array optimization method, as exemplarily embodied, succeeds in effecting design optimization of a fixed or portable sensor array system so that it is quickly deployable for more efficient and effective ranging. According to exemplary inventive practice, the design parameters that are taken into account include but are not limited to sensor array geometry (e.g., sensor arrangement, sensor spacing), sensor response, and sensor noise characteristics.

Exemplary practice of the present invention provides a computer-implemented method for optimizing an electromagnetic sensor array. The inventive method comprises: obtaining values for a plurality of physical environmental characteristics; defining a physical environmental geometry; establishing an electromagnetic sensor array for being situated in the physical environmental geometry; identifying at least one electromagnetic source for being situated in the physical environmental geometry; performing design optimization of the electromagnetic sensor array. The defining of the physical environmental geometry includes consideration of the obtained values for the physical environmental characteristics. The electromagnetic sensor array includes a plurality of electromagnetic sensors. The performing of the design optimization includes evaluating the electromagnetic sensor array in terms of calculability, via the electromagnetic sensor array, of at least one electric field and at least one magnetic field associated with at least one electromagnetic source.

BRIEF DESCRIPTION OF THE DRAWINGS

The present invention will now be described, by way of example, with reference to the accompanying figures, wherein:

FIGS. 1 through 4 show source track and total magnetic field for a source with a CPA (closest point of approach) of 2 m. FIGS. 5 through 8 show source track and total magnetic field for a source with a CPA (closest point of approach) of 20 m.

DESCRIPTION OF EXEMPLARY EMBODIMENTS OF THE INVENTION

Reference is now made to FIGS. 1 through 8, which illustrate a hypothetical example of a practical situation that highlights a need for optimal sensor arrangement in accordance with the present invention. In this example, a sensor is placed on a seafloor where typical water conductivities are around 5 S/m and typical water depths are around 20 m, near the shore. A 1000 Hz submerged horizontal electric dipole source runs over the sensor, as well as 20 m to the east of the sensor.

The benefits of inventive practice are manifest when assessing the impacts on a measured field due to various possible scenarios. For example, such impacts may include the following: (i) impact of the source running over top, as opposed to 20 m to the east; (ii) impact of the position of the sensor or of the source; and (iii) impact of change in source heading, e.g., orientation of the source track with respect to the sensor. FIGS. 1 through 8 illustrate these impacts in some detail.

FIGS. 1 through 4 show the source track and total magnetic field envelope for a source with a CPA (closest point of approach) of 2 m. FIGS. 5 through 8 show the source track and total magnetic field for a source with a CPA (closest point of approach) of 20 m. As demonstrated in FIGS. 1 through 8, when the source is close to the sensor, the heading makes a large impact on the magnitude of the total magnetic field.

Furthermore, if for instance we want to add ten more sensors in a line to this existing sensor, we shall need to determine, inter alia, the following unknowns in accordance with the present invention: (i) the optimal spacing of the eleven aligned sensors; and (ii) the optimal orientation of the line of eleven sensors with respect to True North. To determine the optimal spacing, we need to take into account the most important range of measurement frequencies. All of the unknowns, or at least the significant unknowns, should be answered before building and laying down a new sensor array. These unknowns are answered by practicing optimization of an electromagnetic measurement sensor array in accordance with the present invention.

Exemplary practice of the present invention takes into consideration the broad range of parameters that need to be considered in designing an optimal measurement sensor array. Inventive practice quickly and efficiently sweeps across the "trade space" of parameters, thereby yielding the optimal set of design parameters. Exemplary inventive practice includes a computational optimization procedure to derive the optimal set of design parameters, for a given set of electromagnetic sources, set of environmental characteristics, and air-sea-seafloor geometry. Among other benefits, exemplary practice of the present invention's design optimization method—which is inventively performed prior to building a sensor array—will afford substantial savings in terms of overall costs and post-analysis efforts.

As exemplarily embodied, the inventive method is a computer-implemented method that includes calculations of alternating electromagnetic signatures. For instance, an exemplary inventive computer model incorporate elements of a standalone alternating electromagnetic signature computer model. In testing their invention, the present inventors used a verified computational model that was developed by the United States Navy for accurate, reliable, and robust calculation of alternating (AC) electromagnetic fields, due to a diverse set of sources, at frequencies ranging from 0 Hz to several tens of kHz. According to this Navy model for predicting alternating electromagnetic signatures, the sources included: point and extended horizontal electric dipole (HED); point and extended vertical electric dipole (VED); point and extended horizontal magnetic dipole (HMD); and point and extended vertical magnetic dipole (VMD). In conducting their testing, the present inventors developed a forward propagation AC model to generate electromagnetic fields, ran verification models, and developed MATLAB code to calculate the detailed fields for various sensor array design parameters including configurations and locations of sensors, sensor arrays, and sources, types of sources, and air-sea-seafloor geometries.

In the light of the instant disclosure, the ordinarily skilled artisan will appreciate the various alternating electromagnetic signature modeling techniques that may be suitable for implementation in practicing the present invention. In particular, known in the art are mathematical models of the underwater electromagnetic (UEM) alternating (AC) signatures of naval vessels. Among the considerations for selecting or formulating an analytic/predictive mathematical modeling component suitable for effectuation in exemplary practice of the present invention, it is preferable that the modeling component have a breadth and versatility of potential coverage of practical situations in terms of range of frequencies (e.g., not limited to very low frequencies) and diversity of sources, and that the modeling component be compatible with the present invention's three-dimensional environmental geometry.

Figure 1:
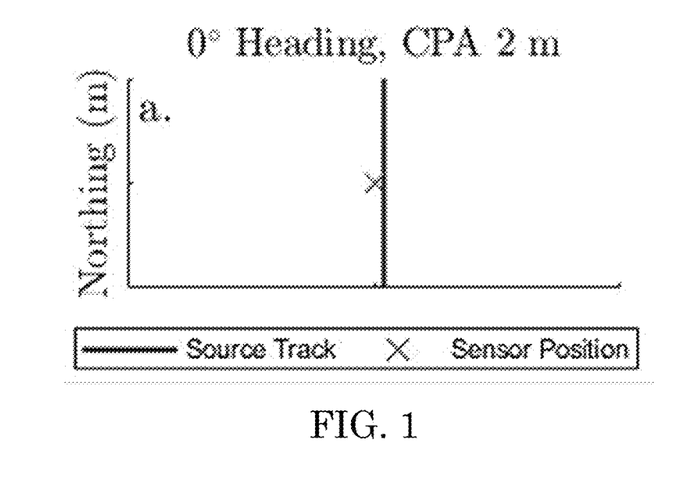
FIGS. 1 through 8 are graphs illustrating, by way of example, the impact that heading, source position, and sensor position have on the total magnetic field envelope that is produced.
Figure 2:
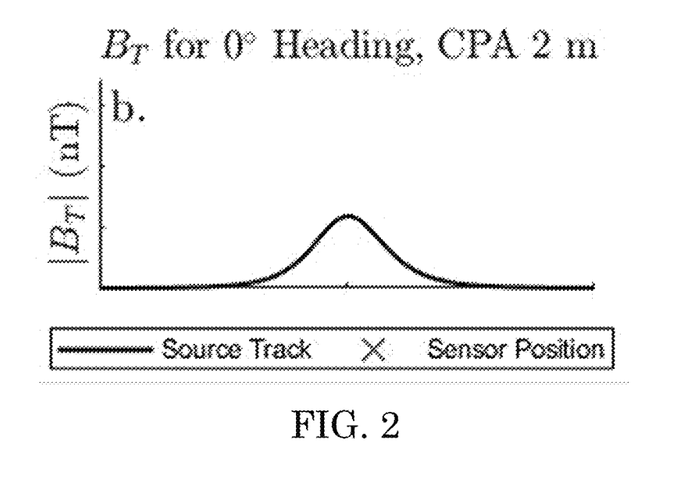
Figure 3:
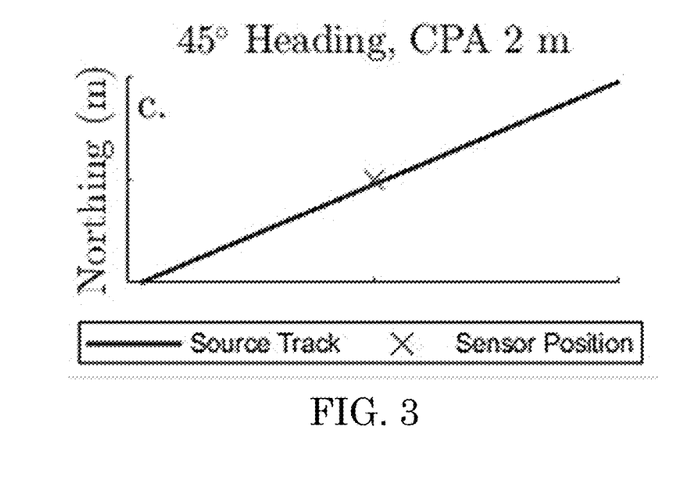
Figure 4:
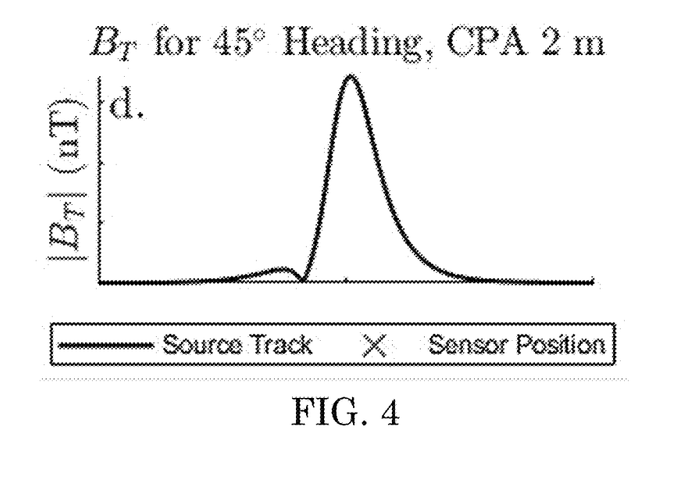
Figure 5:
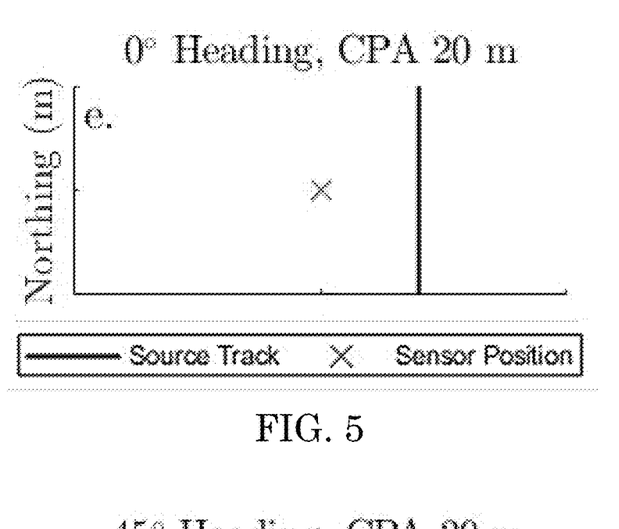
Figure 6:
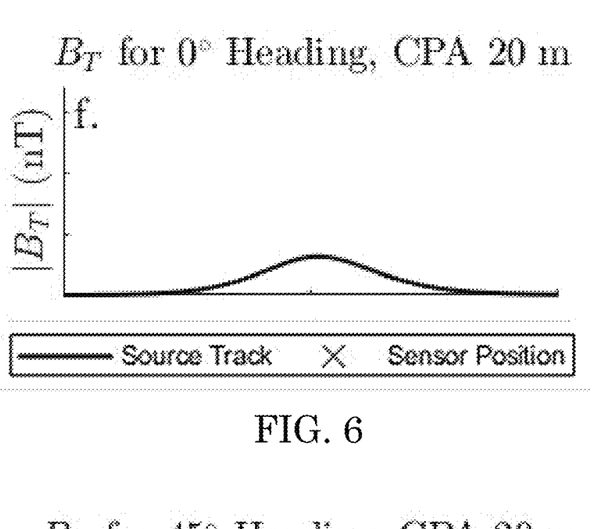
Figure 7:
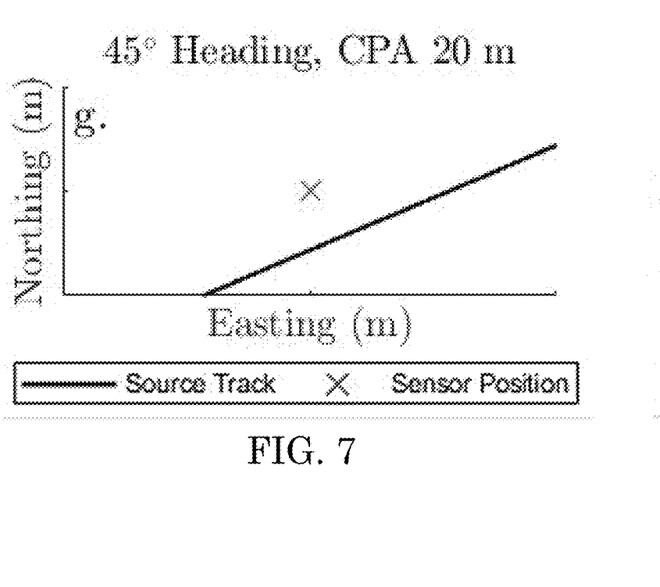
Figure 8:
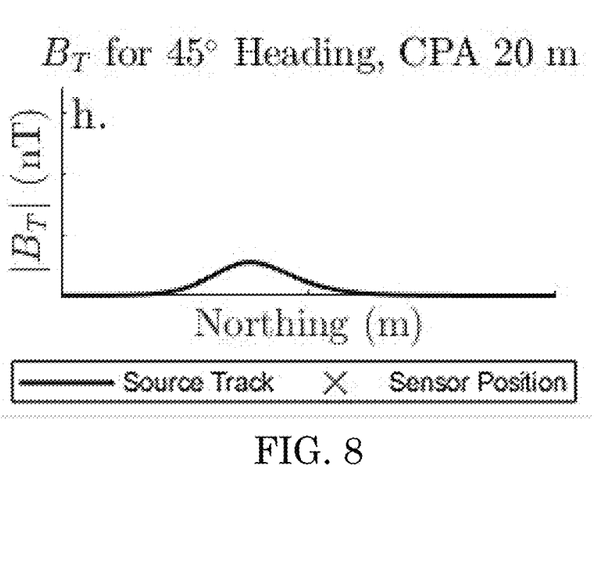
Figure 9:
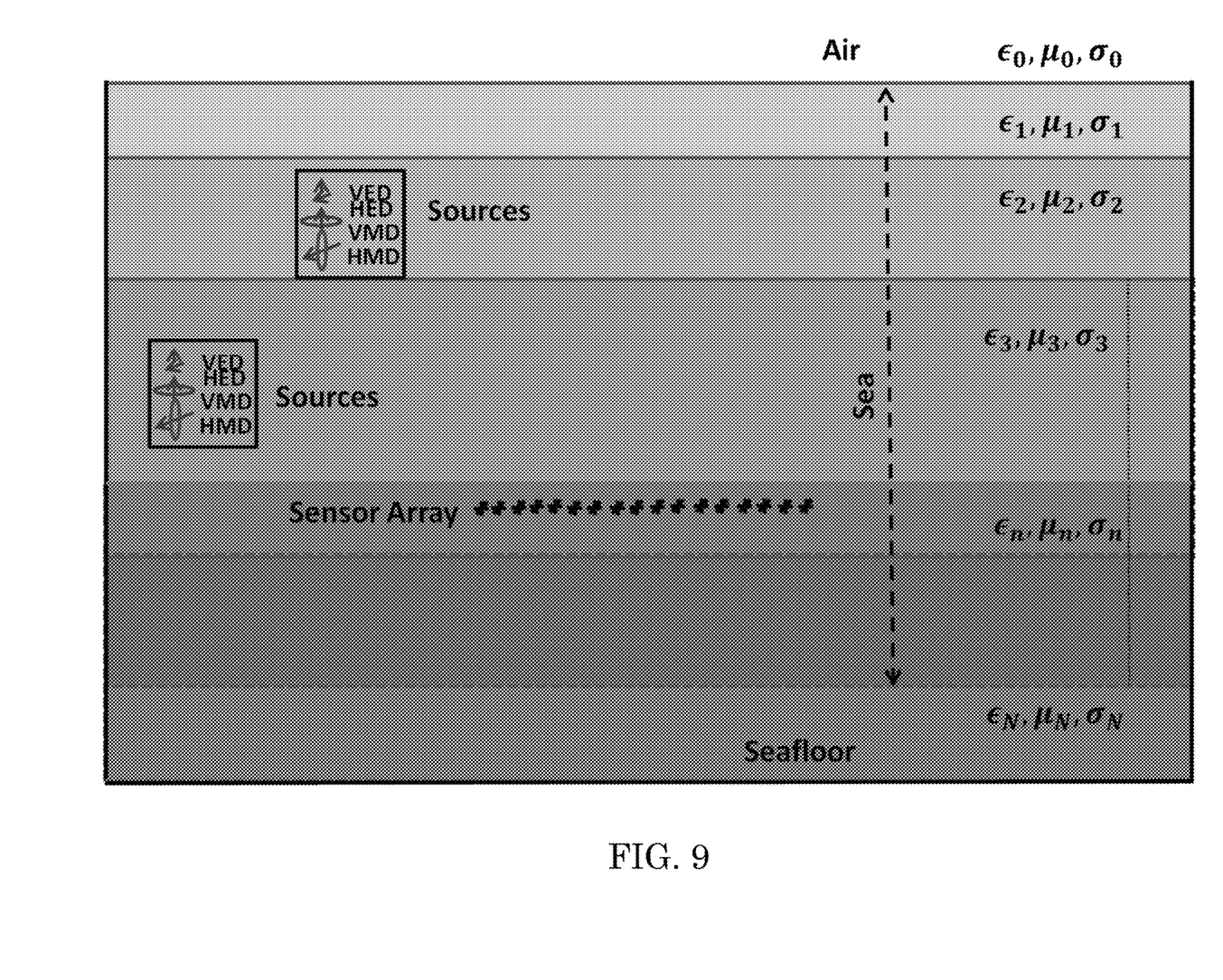
FIG. 9 is a schematic showing, by way of example of practice of the present invention, a layered geometry having a seafloor, several underwater layers above the seafloor, and a layer of air above the water. The layers are characterized by varying conductivities (conductivity-related properties), varying electromagnetic properties, diverse sources, and a sensor array situated in at least one of the underwater layers.

With reference to FIG. 9, exemplary inventive methodology features, inter alia, its contextualization in a physically defined three-dimensional environmental geometry. The spatial environmental geometry is physically defined both geographically and electromagnetically.

As geographically defined, a physical environmental geometry such as shown in FIG. 9 is tripartite in nature, characterized by three adjacent horizontal geographic regions, viz.: (i) an electromagnetically conductive seafloor region; (ii) an electromagnetically conductive sea region, above the seafloor; and (iii) an electromagnetically conductive air (atmosphere) region, above the sea.

As electromagnetically defined, a physical environmental geometry such as shown in FIG. 9 is further characterized by at least three adjacent horizontal electromagnetic layers (zones), wherein each geographic region encompasses at least one electromagnetic layer. According to exemplary inventive practice, the electromagnetic layers span between an upper extreme and a lower extreme. By way of explanation, starting at the upper extreme the electromagnetic layers begin in the geographic air region as a single electromagnetic air layer, proceed downward in the geographic sea region through plural (e.g., several) electromagnetic sea layers, and end in the geographic seafloor region as a single electromagnetic seafloor level. Each electromagnetic layer is characterized by its own conductivity, permittivity, and permeability. Other electromagnetic phenomena, such as local manifestations of the earth's magnetic field, may also be reflected in the electromagnetic definition of the physical environmental geometry.

The term "sea," as used herein, broadly refers to a sea or ocean or other large body of water. The term "seafloor," as used herein, broadly refers to a seafloor, seabed, ocean floor, or other bottom/bottommost/underlying solid surface of a large body of water The term "air," as used herein, broadly refers to atmospheric gas or gases such as situate above land or sea.

As denoted in FIG. 9, the symbols $\sigma_n$, $\epsilon_n$, $\mu_n$ represent the conductivity, permittivity, and permeability, respectively, in the "nth" layer of the tripartite geometric space. FIG. 9 is a two-dimensional graphic representation of a three-dimensional geometric space. In this example, the geometric space describes a rectangular prism. The horizontal regions and layers of the of the universal rectangular prismatic space describe "thinner" rectangular prisms, each having the same horizontal expanse and a smaller vertical height. Depending on the embodiment, inventive practice may provide for two-dimensional and/or three-dimensional computer graphic representation similar to that shown in FIG. 9.

In accordance with varied practice of the present invention, the sources and sensors can be anywhere in air, in sea, or on seafloor, such as depicted by way of example in FIG. 9. Collectively considered, the layered spatial geometry represents a kind of "gradient" of values for electromagnetic properties including conductivity, permittivity, and permeability. Depending on the inventive embodiment, the sea can have one layer or more than one layer. A source, or a sensor, or an array of sensors may be situate in one layer or at least two adjacent layers.

The EMF-calculative component of an inventive model preferably is capable of rendering efficacious calculations of electric and magnetic fields in the context of the environmental geometry that is geographically and electromagnetically defined by the inventive model. In comparison with actual electromagnetic measurements, electromagnetic calculations that neglect the seafloor will tend to yield more approximate results (or perhaps even erroneous results) with respect to the electric and magnetic fields, especially when the source(s) and/or sensor(s) are near the seafloor. Signature measurements from calibrated source tests over electric and magnetic sensor arrays may be compared against signature model calculations, in order to assess performance of the EMF-calculative component of the inventive model, especially in terms of predicting the UEM AC signatures that are considered in the inventive model.

Figure 10:
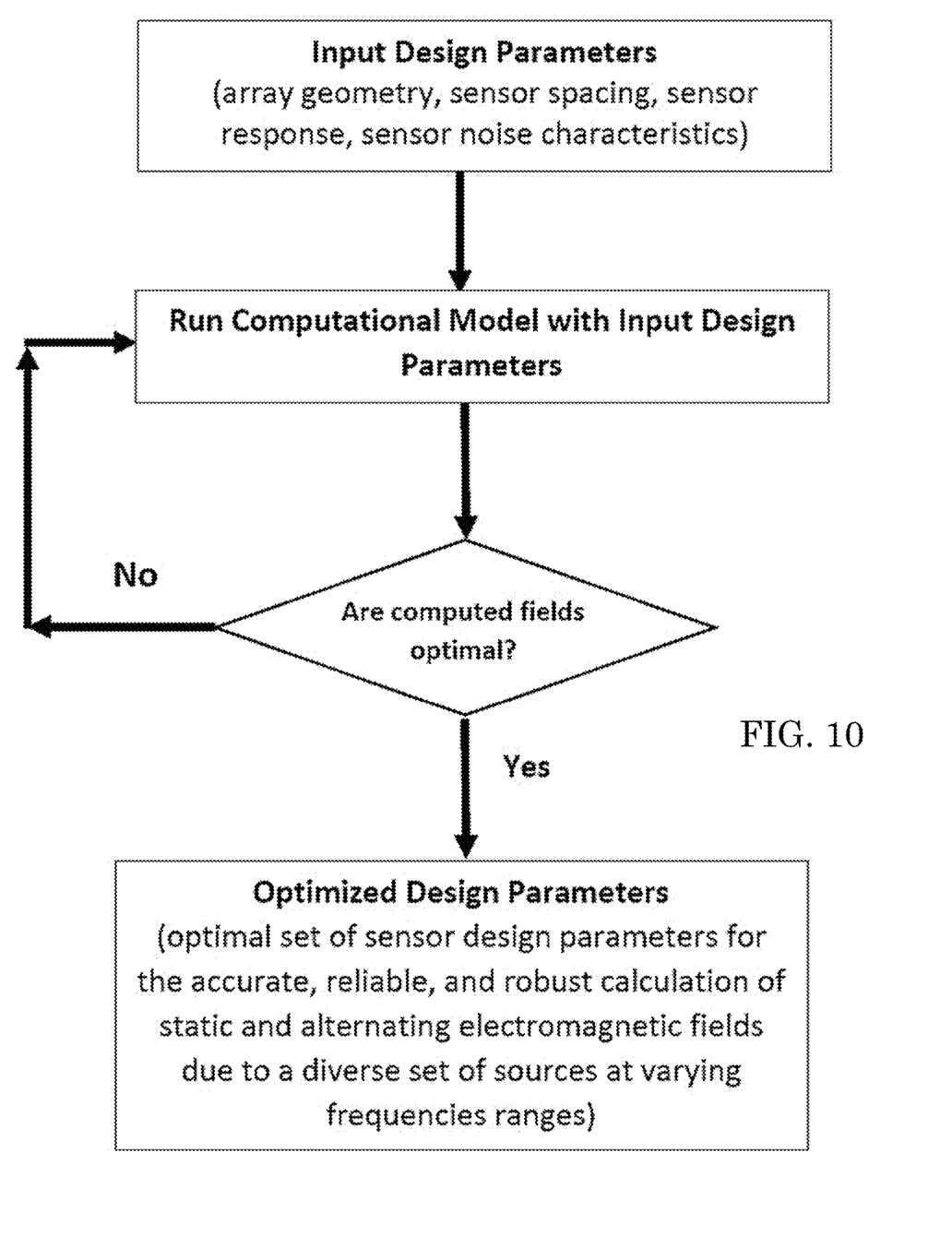
FIG. 10 is a flow diagram illustrating an embodiment of a method, in accordance with the present invention, of optimizing an electromagnetic measurement sensor array for efficient and accurate calibration of electromagnetic signatures.
Figure 11:
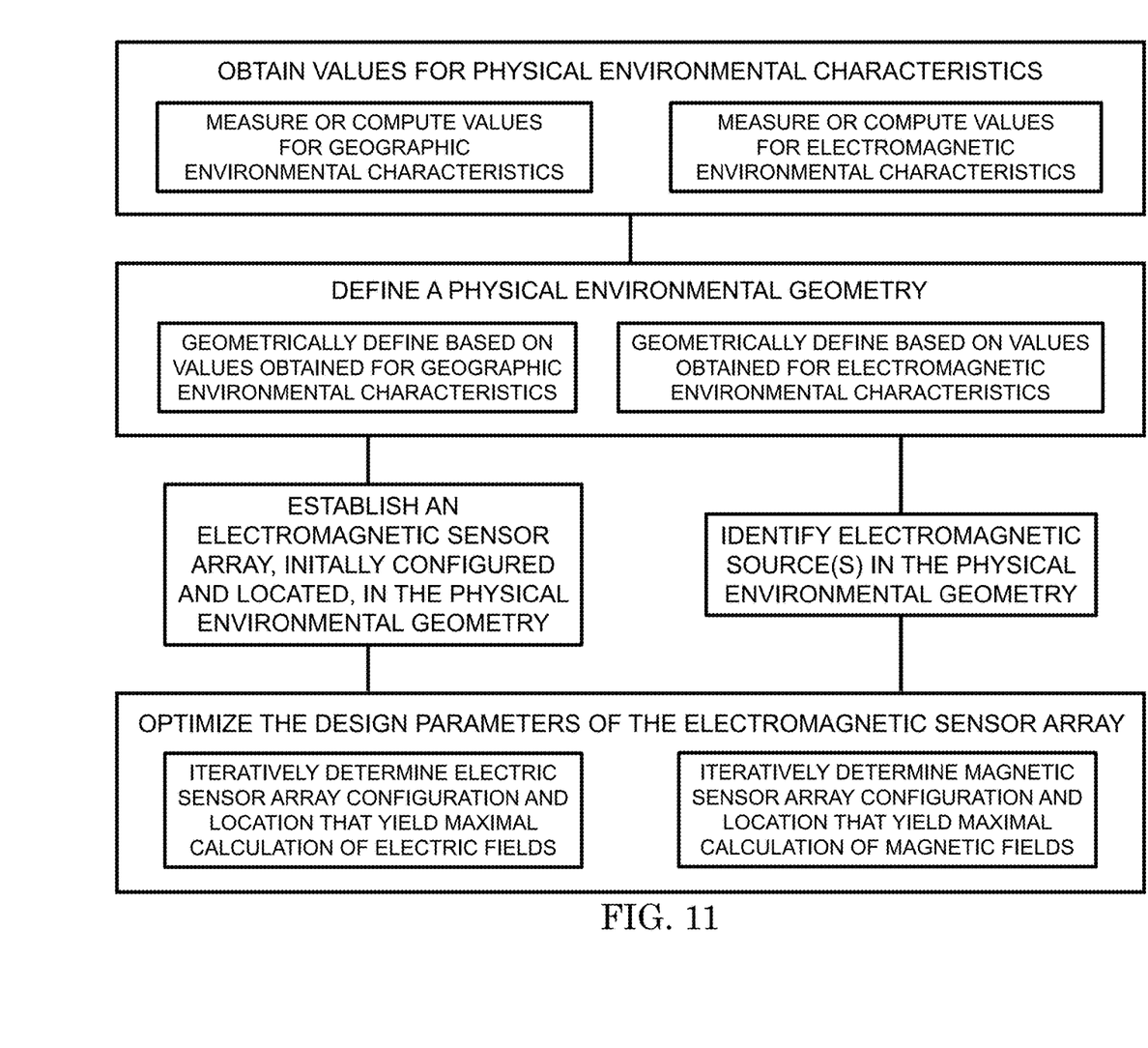
FIG. 11 is a flow diagram illustrating an example of electromagnetic measurement sensor array optimization, in accordance with the present invention, at a single electromagnetic frequency of interest or within a narrow range of electromagnetic frequencies of interest. The present invention's iterative optimization steps such as shown in FIG. 11 can be repeated at other selected frequencies or frequency bands, in order to achieve a more comprehensive sensor array optimization over a broader range or set of frequencies.

As diagrammatically summarized in FIGS. 10 and 11, an exemplary inventive method includes the steps described hereinbelow. It is to be understood that the present invention can be multifariously embodied so to add to, subtract from, change, and/or reorder the following inventive steps.

First, the inventive practitioner obtains (e.g., measures, calculates, estimates, and/or looks up) physical environmental characteristics, including: seafloor depth; conductivity; permittivity; permeability; and local manifestation(s) of the earth's magnetic field. The physical environmental characteristics may be obtained, for example, by conducting on-site measurements using a conductivity-temperature-depth (CTD) cast that will simultaneously yield conductivity, permittivity, and bathymetry profiles as a function of local position needed for practicing a particular embodiment of the present invention. In addition, an actual background local magnetic field measurement using a tri-axial and total-field magnetometer system will yield the local earth's magnetic field values needed for practicing the inventive embodiment.

Second, using the values obtained for the physical environmental characteristics, the inventive practitioner defines a "notional" three-dimensional/spatial physical environmental geometry having both geographic and electromagnetic characteristics. The physical environmental geometry is characterized by a tripartite geographic configuration describing an air region, a sea region, and a seafloor region, and by a multilayer electromagnetic configuration describing different magnitudes of conductivity, permittivity, and permeability, as well as local manifestation(s) of the earth's magnetic field. The physical environmental geometry represents the setting for the electromagnetic sources of interest, and for the electromagnetic sensor array being designed in relation to the electromagnetic sources of interest.

Third, the inventive practitioner describes at least one "notional" electromagnetic source in terms of its structural and functional characteristics and its location in the physical environmental geometry. A source may be representative, for instance, of a marine vessel. According to exemplary inventive practice, a set of sources (two or more sources) is of interest to the inventive practitioner. The sources of the source set are characterized by respective source strengths. The electromagnetic fields emanated by the sources are linearly proportional to the source strengths; thus, according to exemplary inventive practice, the electromagnetic fields can simply be scaled up or down.

Fourth, the inventive practitioner assumes the existence of an electromagnetic sensor array in the physical environmental geometry. This is the electromagnetic sensor array that is evaluated in relation to the one or more electromagnetic sources also present in the physical environmental geometry. The inventive practitioner further assumes an initial location and configuration of the electromagnetic sensor array, within the physical environmental geometry. The sensor array is initially configured and located as an initial set of configurative and locational values for the ensuing iterative process. For purposes of the inventive modeling, the inventive practitioner also assumes that the electric and magnetic sensors are "perfect," i.e., devoid of noise. This is a valid assumption for exemplary inventive practice inasmuch as the sensor and background noise characteristics are independent of the sensor geometry, and the present invention seeks to optimize the sensor geometry.

Fifth, the inventive practitioner evaluates the electromagnetic sensor array, with a view toward optimizing its location and configuration. To this end, the inventive practitioner considers sensor array design parameters including, but not limited to, the following: distance of sensor array from source; position of sensor array; orientation (e.g., angularity or direction) of sensor array relative to source; number of sensors in sensor array; types (e.g., strengths or operative principles) of sensors in sensor array; arrangement (e.g., ordering) of sensors in sensor array; orientation of sensors in sensor array; spacing of sensors in sensor array. The terms "location" and "configuration" are used together herein to describe the nature, character, and situation of an electromagnetic sensor array, describing same in a manner that encompasses the sensor array design parameters being taken into consideration in practicing a particular inventive embodiment.

In performing the evaluation of the electromagnetic sensor array according to the fifth step of exemplary inventive practice, the inventive practitioner dichotomizes the electromagnetic sensor array into an electric sensor array and a magnetic sensor array. That is, the inventive practitioner assumes an independent electric sensor array and an independent magnetic sensor array, and separately albeit similarly evaluates the electric sensor array and the magnetic sensor array.

With regard to the electric sensing, the inventive practitioner initially assumes a location and configuration of the electric sensor array in terms of orientation, spacing, distance from electric source(s), and other sensor array design parameters of the electric sensor array. The inventive practitioner calculates the electric fields with respect to the electric sensor array characterized by its initial location and configuration. Then, in furtherance of optimizing the electric sensor array, the inventive practitioner iterates, at least once and preferably more than once (e.g., several or many times), the electric field calculation over selectively varied locations and configurations of the electric sensor array. The inventive practitioner thereby determines an optimal electric sensor array in terms of location and configuration. For instance, the inventive practitioner determines the electric sensor array that is optimal insofar as it will yield the maximum calculated electric fields as a function of electric source and sensor distance (vertical and offset) from the electric source.

Similarly, with regard to the magnetic sensing, the inventive practitioner initially assumes a location and configuration of the magnetic sensor array in terms of orientation, spacing, distance from magnetic source(s), and other sensor array design parameters of the magnetic sensor array. The inventive practitioner calculates the electric fields with respect to the magnetic sensor array characterized by its initial location and configuration. Then, in furtherance of optimizing the magnetic sensor array, the inventive practitioner iterates, at least once and preferably more than once (e.g., several or many times), the magnetic field calculation over selectively varied locations and configurations of the magnetic sensor array. The inventive practitioner thereby determines an optimal magnetic sensor array in terms of location and configuration. For instance, the inventive practitioner determines the magnetic sensor array that is optimal insofar as it will yield the maximum calculated magnetic fields as a function of magnetic source and sensor distance (vertical and offset) from the magnetic source.

Sixth, according to some inventive embodiments the inventive practitioner takes his/her iterative evaluation of the electromagnetic sensor array a step further by additionally performing the iterative evaluation relative to electromagnetic frequency. In this regard, the inventive practitioner runs his/her iterative evaluation of the electromagnetic sensor array as a function of a frequency range (or plural frequency bands) of interest, thereby further optimizing the configuration and location of the electromagnetic sensor array. The inventive model calculates the electric and magnetic fields in the fifth inventive step, above, and feeds the data thus obtained into this, the sixth inventive step.

The following discussion illustrates, by way of example, an inventive procedure conducted to calculate the electromagnetic fields due to an AC or DC electric or magnetic dipole source. This example involves the specific case of a horizontal electric dipole (HED) or strength p and frequency $\omega = 2\eta f$. This electromagnetic source is chosen herein for illustrative purposes because it is a source of potentially great practical importance. Such a dipole source produces electric fields and magnetic fields that oscillate with a frequency $\omega = 2\pi f$. Mathematically, we denote these fields respectively by $$E(r,t) = E(r)e^{i\omega t} \text{ and } B(r,t) = B(r)e^{i\omega t} \quad (1)$$

In equation (1), above, the bold-faced symbols denote that the quantities are three-dimensional vectors. The symbol r denotes the three-dimensional position vector where the fields are measured or calculated. The symbol t denotes the time when the fields are measured or calculated.

The electromagnetic fields must satisfy Maxwell's equations and we list below the essential set of equations for our consideration:

$$\nabla \times E = i\omega B, \nabla \times B = \mu_o(J_s[\sigma + i\omega \in]E) \quad (2)$$

In the above equations set (2), $J_s$ denotes the current due to the source, e.g. a horizontal electric dipole source, $\nabla \times$ denotes the usual curl operator, and all other symbols have been defined in the schematic above.

In this example, the inventive mathematical model calculates the time and space dependent electric and magnetic fields, $E(r, t) = E(r)e^{i\omega t}$ and $B(r, t) = B(r)e^{i\omega t}$, by solving the coupled Maxwell's equations given in Equation (1), subject to the usual boundary conditions, viz. that $B(r, t)$ is continuous across all boundaries and the tangential components of $E(r, t)$, i.e. $E_x(r,t)$, $E_y(r,t)$ are continuous across all boundaries.

The present invention, as exemplarily embodied, saves time and resources by rapidly generating an optimal set of sensor design parameters. Exemplary inventive practice increases a user's flexibility to lay down future portable sensor arrays. Methods have previously been considered that focus upon a use of algorithms for efficient inverse modeling of controlled source electromagnetic (CSEM) applications. In contrast, exemplary inventive practice features, inter alia, an optimization of sensor array characteristics that include but are not limited to geometry.

The present inventors considered an alternative approach whereby detailed measurements of electromagnetic fields are conducted at candidate sensor locations at a set of candidate frequencies, and these measurements are used to empirically optimize the array parameters; however, an alternative procedure of this kind would be time-consuming and expensive. Another alternative approach considered by the present inventors uses an electric field model to evaluate the electric fields at 0 Hz (DC) due to electric dipole sources (HED, VED) and assumes that the optimal set of sensor parameters evaluated at 0 Hz would hold for AC (i.e., at frequencies up to several tens of kHz) and for all possible source configurations; however, this assumption could lead to erroneous or sub-optimal sensor configurations.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A computer-implemented method for optimizing an electromagnetic sensor array, the method comprising:
   obtaining values for a plurality of physical environmental characteristics, said physical environmental characteristics including geographic environmental characteristics and electromagnetic environmental characteristics;
   defining a three-dimensional geometric space, wherein said defining of said three-dimensional geometric space includes:
      considering the obtained said values for said geographic environmental characteristics and said electromagnetic environmental characteristics;
      based on said values obtained for said geographic environmental characteristics, defining said three-dimensional geometric space in terms of an air region, a sea region, and a seafloor region, wherein said seafloor region is characterized by a sea depth;
      based on said values obtained for said electromagnetic environmental characteristics, defining said three-dimensional geometric space in terms of at least one layer in each of said air region, said sea region, and said seafloor region, wherein each said layer describes its own electromagnetic environmental character with respect to at least one of conductivity, permittivity, permeability, and locally manifested earth's magnetic field;

establishing an electromagnetic sensor array for being situated in said three-dimensional geometric space, said electromagnetic sensor array including a plurality of electromagnetic sensors;
identifying at least one electromagnetic source for being situated in said three-dimensional geometric space;
performing design optimization of said electromagnetic sensor array, wherein said performing of said design optimization includes:
selecting a plurality of variations of said electromagnetic sensor array, wherein each said variation of said electromagnetic sensor array is attributed with at least one sensor array design parameter, and wherein each said variation of said electromagnetic sensor array differs from every other variation of said electromagnetic sensor array variation with respect to at least one value for said at least one sensor array design parameter with which said variation of said electromagnetic sensor array is attributed;
evaluating said electromagnetic sensor array, wherein said evaluating of said electromagnetic sensor array includes comparing said plurality of variations of said electromagnetic sensor array in terms of calculability, via each said variation of said electromagnetic sensor array, of at least one electric field and at least one magnetic field associated with said at least one electromagnetic source.

2. The computer-implemented method for optimizing an electromagnetic sensor array as recited in claim 1, wherein said obtaining of said values for said physical environmental characteristics includes measuring at least one said value for at least one said physical environmental characteristic.

3. The computer-implemented method for optimizing an electromagnetic sensor array as recited in claim 1, wherein said obtaining of said values for said physical environmental characteristics includes computing at least one said value for at least one said physical environmental characteristic.

4. The computer-implemented method for optimizing an electromagnetic sensor array as recited in claim 1, wherein each said sensor array design parameter is selected from the group consisting of:
position of said electromagnetic sensor array in said three-dimensional geometric space;
distance of said electromagnetic sensor array from said electromagnetic source;
orientation of said electromagnetic sensor array relative to said electromagnetic source;
number of said electromagnetic sensors in said electromagnetic sensor array;
types of said electromagnetic sensors in said electromagnetic sensor array;
spacing of said electromagnetic sensors in said electromagnetic sensor array.

5. An apparatus comprising a computer having computer code characterized by computer program logic for optimizing an electromagnetic sensor array, said computer code being executable by said computer so that, in accordance with said computer program logic, said computer performs acts including:
obtaining values for a plurality of physical environmental characteristics, said physical environmental characteristics including geographic environmental characteristics and electromagnetic environmental characteristics;
defining a three-dimensional geometric space, wherein said defining of said three-dimensional geometric space includes:
considering the obtained said values for said geographic environmental characteristics and said electromagnetic environmental characteristics;
based on said values obtained for said geographic environmental characteristics, defining said three-dimensional geometric space in terms of an air region, a sea region, and a seafloor region, wherein said seafloor region is characterized by a sea depth;
based on said values obtained for said electromagnetic environmental characteristics, defining said three-dimensional geometric space in terms of at least one layer in each of said air region, said sea region, and said seafloor region, wherein each said layer describes its own electromagnetic environmental character with respect to at least one of conductivity, permittivity, permeability, and locally manifested earth's magnetic field;
establishing an electromagnetic sensor array for being situated in said three-dimensional geometric space, said electromagnetic sensor array including a plurality of electromagnetic sensors;
identifying at least one electromagnetic source for being situated in said three-dimensional geometric space;
performing design optimization of said electromagnetic sensor array, wherein said performing of said design optimization includes:
selecting a plurality of variations of said electromagnetic sensor array, wherein each said variation of said electromagnetic sensor array is attributed with at least one sensor array design parameter, and wherein each said variation of said electromagnetic sensor array differs from every other variation of said electromagnetic sensor array variation with respect to at least one value for said at least one sensor array design parameter with which said variation of said electromagnetic sensor array is attributed;
evaluating said electromagnetic sensor array, wherein said evaluating of said electromagnetic sensor array includes comparing said plurality of variations of said electromagnetic sensor array in terms of calculability, via each said variation of said electromagnetic sensor array, of at least one electric field and at least one magnetic field associated with said at least one electromagnetic source.

6. The apparatus of claim 5, wherein said obtaining of said values for said physical environmental characteristics includes at least one of:
inputting at least one measured said value for at least one said physical environmental characteristic;
computing at least one said value for at least one said physical environmental characteristic.

7. The apparatus of claim 6, wherein each said sensor array design parameter is selected from the group consisting of:
position of said electromagnetic sensor array in said three-dimensional geometric space;
distance of said electromagnetic sensor array from said electromagnetic source;
orientation of said electromagnetic sensor array relative to said electromagnetic source;
number of said electromagnetic sensors in said electromagnetic sensor array;
types of said electromagnetic sensors in said electromagnetic sensor array;
spacing of said electromagnetic sensors in said electromagnetic sensor array.

8. The apparatus of claim 5, wherein said design optimization of said electromagnetic sensor array is performed with respect to at least one of the following:
- at least two electromagnetic frequencies;
- at least two electromagnetic frequency ranges;
- at least one electromagnetic frequency and at least one electromagnetic frequency range.

9. A computer program product for optimizing an electromagnetic sensor array, the computer program product comprising a non-transitory computer-readable storage medium having computer-readable program code portions stored therein for execution by a computer, the computer-readable program code portions including:
- a first executable program code portion, for obtaining values for a plurality of physical environmental characteristics, said physical environmental characteristics including geographic environmental characteristics and electromagnetic environmental characteristics;
- a second executable program code portion, for defining a three-dimensional geometric space, wherein said defining of said three-dimensional geometric space includes:
  - considering the obtained said values for said geographic environmental characteristics and said electromagnetic environmental characteristics;
  - based on said values obtained for said geographic environmental characteristics, defining said three-dimensional geometric space in terms of an air region, a sea region, and a seafloor region, wherein said seafloor region is characterized by a sea depth;
  - based on said values obtained for said electromagnetic environmental characteristics, defining said three-dimensional geometric space in terms of at least one layer in each of said air region, said sea region, and said seafloor region, wherein each said layer describes its own electromagnetic environmental character with respect to at least one of conductivity, permittivity, permeability, and locally manifested earth's magnetic field;
- a third executable program code portion, for establishing an electromagnetic sensor array for being situated in said three-dimensional geometric space, said electromagnetic sensor array including a plurality of electromagnetic sensors;
- a fourth executable program code portion, for identifying at least one electromagnetic source for being situated in said three-dimensional geometric space;
- a fifth executable program code portion, for performing design optimization of said electromagnetic sensor array, wherein said performing of said design optimization includes:
  - selecting a plurality of variations of said electromagnetic sensor array, wherein each said variation of said electromagnetic sensor array is attributed with at least one sensor array design parameter, and wherein each said variation of said electromagnetic sensor array differs from every other variation of said electromagnetic sensor array variation with respect to at least one value for said at least one sensor array design parameter with which said variation of said electromagnetic sensor array is attributed;
  - evaluating said electromagnetic sensor array, wherein said evaluating of said electromagnetic sensor array includes comparing said plurality of variations of said electromagnetic sensor array in terms of calculability, via each said variation of said electromagnetic sensor array, of at least one electric field and at least one magnetic field associated with said at least one electromagnetic source.

10. The computer program product of claim 9, wherein said obtaining of said values for said physical environmental characteristics includes at least one of:
- inputting at least one measured said value for at least one said physical environmental characteristic;
- computing at least one said value for at least one said physical environmental characteristic.

11. The computer program product of claim 9, wherein each said sensor array design parameter is selected from the group consisting of:
- position of said electromagnetic sensor array in said three-dimensional geometric space;
- distance of said electromagnetic sensor array from said electromagnetic source;
- orientation of said electromagnetic sensor array relative to said electromagnetic source;
- number of said electromagnetic sensors in said electromagnetic sensor array;
- types of said electromagnetic sensors in said electromagnetic sensor array;
- spacing of said electromagnetic sensors in said electromagnetic sensor array.

12. The computer program product of claim 9, wherein said design optimization of said electromagnetic sensor array is performed with respect to at least one of the following:
- at least two electromagnetic frequencies;
- at least two electromagnetic frequency ranges;
- at least one electromagnetic frequency and at least one electromagnetic frequency range.

\* \* \* \* \*